United States Patent
Chui et al.

(10) Patent No.: US 8,773,110 B2
(45) Date of Patent: Jul. 8, 2014

(54) METHOD AND APPARATUS FOR WAVE DETECTION

(75) Inventors: Siew Yong Chui, Singapore (SG); Rajesh Tiruvuru, Nagalapuram (IN)

(73) Assignee: Marvell World Trade Ltd., St. Michael (BB)

( * ) Notice: Subject to any disclaimer, the term of this patent is extended or adjusted under 35 U.S.C. 154(b) by 350 days.

(21) Appl. No.: 13/190,782

(22) Filed: Jul. 26, 2011

(65) Prior Publication Data

US 2012/0025806 A1 Feb. 2, 2012

Related U.S. Application Data

(60) Provisional application No. 61/368,483, filed on Jul. 28, 2010.

(51) Int. Cl.
*G01R 19/00* (2006.01)

(52) U.S. Cl.
USPC ............ 324/76.11; 324/142; 323/205

(58) Field of Classification Search
USPC ................ 324/76.11, 142; 323/205
IPC ................................. H02M 1/32,1/04
See application file for complete search history.

(56) References Cited

U.S. PATENT DOCUMENTS

| | | | |
|---|---|---|---|
| 5,847,942 A | 12/1998 | Bazinet et al. | |
| 7,266,001 B1 | 9/2007 | Notohamiprodjo et al. | |
| 2009/0146619 A1* | 6/2009 | Janson et al. | 323/207 |
| 2009/0243561 A1 | 10/2009 | Tan et al. | |

OTHER PUBLICATIONS

PCT Notification of Transmittal of the International Search Report and the Written Opinion of the International Searching Authority, or the Declaration, mailed May 18, 2012 in counterpart International Application No. PCT/IB2011/002601.

* cited by examiner

*Primary Examiner* — Vincent Q Nguyen (57) ABSTRACT

Aspects of the disclosure provide method and apparatus for detecting attributes of an input power supply. The method includes receiving a first signal generated based on a second signal that is predictive. The first signal includes a portion that substantially corresponds to the second signal. Further, the method includes detecting attributes of the portion of the first signal that substantially corresponds to the second signal, and determining attributes of the second signal based on the attributes of the portion of the first signal that substantially corresponds to the second signal.

24 Claims, 8 Drawing Sheets

METHOD AND APPARATUS FOR WAVE DETECTION

INCORPORATION BY REFERENCE

This application claims the benefit of U.S. Provisional Application No. 61/368,483, "Voltage Level and Frequency Detection for Rectified Sine Wave with Distorted Trailing Edge" filed on Jul. 28, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Power circuits are used to regulate an input power supply to an appropriate form for driving a load. In an example, a power circuit includes a power factor correction (PFC) circuit to align phases of a driving current with a driving voltage in order to improve driving efficiency.

SUMMARY

Aspects of the disclosure provide method and apparatus for detecting attributes of an input power supply. The method includes receiving a first signal generated based on a second signal that is predictive. The first signal includes a portion that substantially corresponds to the second signal. Further, the method includes detecting attributes of the portion of the first signal that substantially corresponds to the second signal, and determining attributes of the second signal based on the attributes of the portion of the first signal that substantially corresponds to the second signal.

In an embodiment, the second signal includes a leading portion and a trailing portion that is symmetrical to the leading portion. In an example, the second signal has a sinusoidal waveform, and the first signal includes a leading portion that substantially corresponds to the second signal. The method includes detecting a fixed level on the leading portion of the first signal, and predicting a time when a trailing portion of the second signal is at the fixed level. Specifically, the method includes detecting a second level that is larger than the fixed level on the leading portion of the first signal, measuring a time duration between the detection of the fixed level and the second level, detecting the second level on the trailing portion of the first signal, and predicting the time when the trailing portion of the second signal is at the fixed level based on the detection of the second level on the trailing portion of the first signal and the measured time duration.

In another example, the method includes detecting a first proportional-to-peak level on the leading portion of the first signal, detecting a second proportional-to-peak level on the leading portion of the first signal, and measuring a time duration between the detections. Further, the method includes determining at least one of a frequency and a period of the second signal based on the first proportional-to-peak level, the second proportional-to-peak level and the time duration. In addition, the method includes determining a zero-crossing time of the second signal based on the first proportional-to-peak level, the second proportional-to-peak level and a time duration between the detections.

Aspects of the disclosure provide a circuit for detecting attributes of an input power supply, and generating control signals for regulating the input power supply based on the detected attributes. The circuit includes a detection circuit, and a control circuit. The detection circuit is configured to receive a first signal generated based on a second signal that is predictive. The first signal includes a portion that substantially corresponds to the second signal. The detection circuit is configured to detect attributes of the portion of the first signal that substantially corresponds to the second signal, and determine attributes of the second signal based on the attributes of the portion of the first signal that substantially corresponds to the second signal. The control circuit is configured to generate control signals to regulate the second signal based on the determined attributes of the second signal.

Aspects of the disclosure also provide a power circuit for providing power to a load. The power circuit includes a regulation circuit, and a detect-and-control circuit. The regulation circuit is configured to receive an alternating current (AC) power supply having a sinusoidal waveform, regulate the AC power supply to generate an output power supply, and provide the output power supply to the load. The detect-and-control circuit includes a detection circuit and a control circuit. The detection circuit is configured to receive a signal generated based on the AC power supply. The signal includes a portion that substantially corresponds to the AC power supply. The detection circuit is configured to detect attributes of the portion of the signal that substantially corresponds to the AC power supply, and determine attributes of the AC power supply based on the attributes of the portion of the signal that substantially corresponds to the AC power supply. The control circuit is configured to generate control signals based on the determined attributes of the AC power supply, and provide the control signals to the regulation circuit to regulate the AC power supply.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
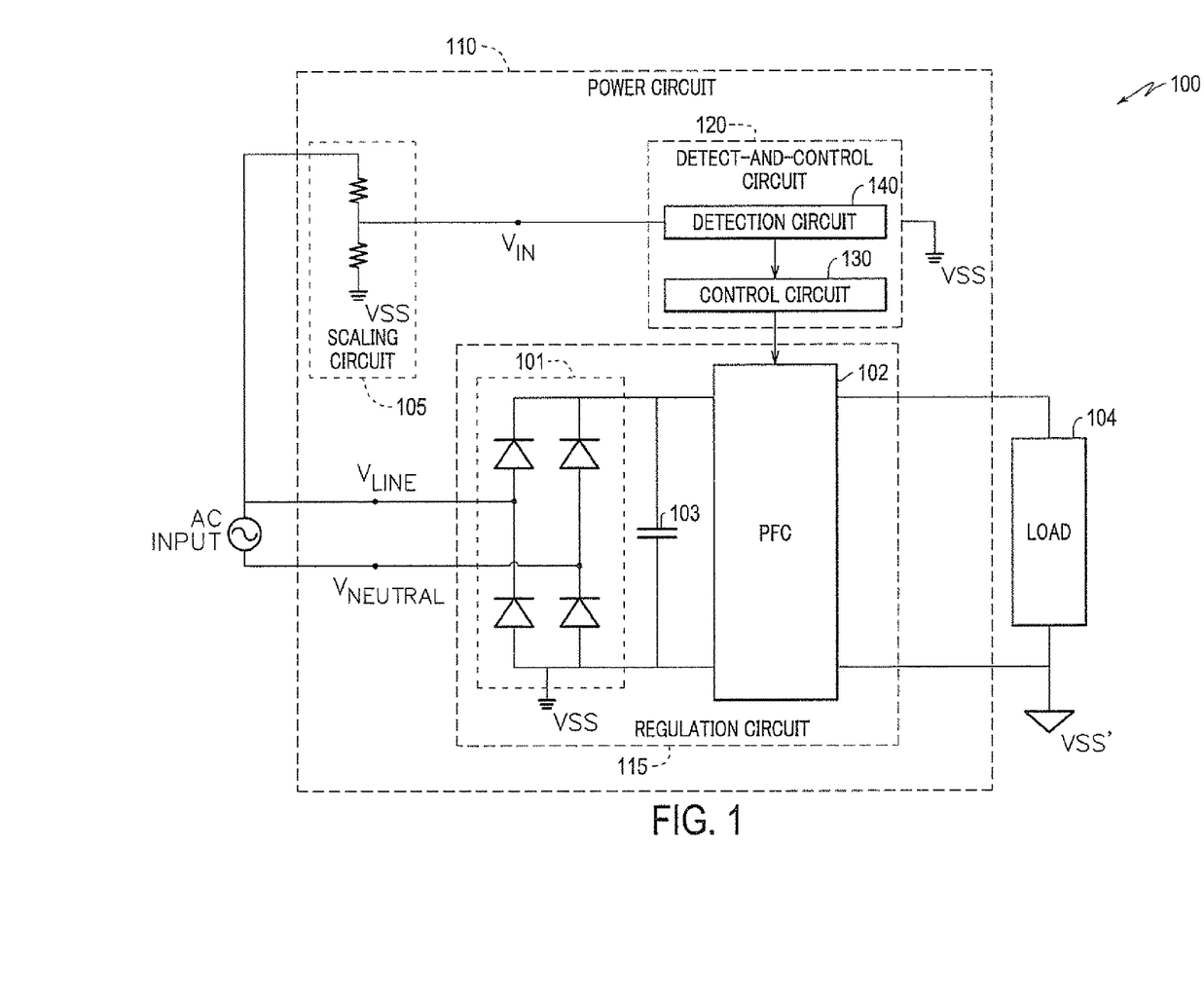
FIG. 1 shows a block diagram of an electronic system example 100 according to an embodiment of the disclosure.

FIG. 1 shows a block diagram of an electronic system example 100 according to an embodiment of the disclosure. The electronic system 100 includes a power circuit 110 that provides power to drive a load 104. The power circuit 110 receives an input power supply, such as an alternating current (AC) power supply having a fire line of a line voltage $V_{LINE}$ and a neutral line of a neutral voltage $V_{NEUTRAL}$ as shown in FIG. 1. The power circuit 110 regulates the input power supply to generate an output power supply having appropriate attributes, and the output power supply drives the load 104.

In the FIG. 1 example, the power circuit 110 includes a detect-and-control circuit 120 and a regulation circuit 115. The detect-and-control circuit 120 is configured to detect attributes of the input power supply, generate control signals based on the detected attributes, and provide the generated control signals to the regulation circuit 115.

The regulation circuit 115 is configured to regulate the input power supply according to the control signals provided by the detect-and-control circuit 120, and provide regulated power supply to the load 104. These elements are coupled together as shown in FIG. 1.

In an example, the detect-and-control circuit 120 is implemented as integrated circuit (IC) on an IC chip. Further, in the example, the ground connection of the IC chip is electrically coupled to a ground connection VSS. It is noted that the load 104 is grounded to VSS'. The ground VSS' can be the same ground as the ground VSS, or can be different from the ground VSS depending on the configuration of the regulation circuit 115. In an embodiment, the electronic system 100 includes a scaling circuit 105 to scale the line voltage $V_{LINE}$ or neutral voltage $V_{NEUTRAL}$ and generates an input voltage $V_{IN}$ within an appropriate range. The input voltage $V_{IN}$ is provided to the IC chip to detect the attributes of the input power supply. In another embodiment, the scaling circuit 105 is not needed, or the scaling circuit 105 is also integrated into the IC chip.

According to an aspect of the disclosure, generally, the line voltage $V_{LINE}$ with regard to the neutral voltage $V_{NEUTRAL}$ has a sinusoidal waveform, and the input voltage $V_{IN}$ with regard to VSS has a half sinusoidal waveform. However, the input voltage $V_{IN}$ with regard to VSS can be distorted due to the load 104.

For example, when the load 104 is relatively heavy (e.g., requires relatively large current), the input voltage $V_{IN}$ with regard to VSS has the half sinusoidal waveform. However, when the load 104 is relatively light (e.g., requires relatively small current), the waveform of the input voltage $V_{IN}$ with regard to VSS is distorted due to insufficient discharging of the capacitor 103. According to an embodiment of the disclosure, the detect-and-control circuit 120 is configured to use the input voltage $V_{IN}$ to detect the attributes of the input power supply, and the detection is independent of load status of the load 104. Thus, the detect-and-control circuit 120 can generate accurate control signals to control the regulation circuit 115.

In an example, the regulation circuit 115 includes a bridge rectifier 101 that rectifies the input from the AC power supply. Further, the regulation circuit 115 includes a power factor correction (PFC) circuit 102 that is configured to align phases of a driving current with a driving voltage to the load 104 to improve driving efficiency. In an example, the line voltage $V_{LINE}$ has a frequency of 50 Hz. The PFC circuit 102 includes a switch (not shown) that is controlled to switch on and off at a much higher frequency than 50 Hz, for example, in the order of KHz. In each switch cycle that the switch is switched on and off, an average driving current is a function of the line voltage $V_{LINE}$ during the switch-on time. Thus, the average driving current has substantially the same phase as the line voltage $V_{LINE}$.

To suitably control the PFC circuit 102, in an example, the detection-and-control circuit 120 is configured to detect various attributes of the line voltage $V_{LINE}$, such as line frequency of the AC power supply, zero-crossing of the line voltage $V_{LINE}$, time when the line voltage $V_{LINE}$ is at a fixed voltage level, and the like, and to generate control signals based on the detected attributes.

According to an embodiment of the disclosure, when the load 104 is relatively heavy, the input voltage $V_{IN}$ with regard to VSS has a half sinusoidal waveform compared to the sinusoidal waveform of the line voltage $V_{LINE}$ with regard to the neutral voltage $V_{NEUTRAL}$. Specifically, when the line voltage $V_{LINE}$ with regard to the neutral voltage $V_{NEUTRAL}$ is larger than or equal to zero, the waveform of the input voltage $V_{IN}$ with regard to VSS follows the waveform of the line voltage $V_{LINE}$ with regard to the neutral voltage $V_{NEUTRAL}$. When the line voltage $V_{LINE}$ with regard to the neutral voltage $V_{NEUTRAL}$ is smaller than zero, the input voltage $V_{IN}$ with regard to VSS keeps at zero.

Further, the waveform of the input voltage $V_{IN}$ with regard to VSS includes leading portions and trailing portions. In an example, the leading portions are portions that rise from zero to peak value of the half sinusoidal waveform, and the trailing portions are portions that drop from the peak value to zero.

According to the embodiment, when the load 104 is relatively light, the leading portions still follow the sinusoidal waveform, but the trailing portions are distorted from the sinusoidal waveform due to insufficient capacitor discharging, for example. In an example, the distortions are relatively small near peaks of the sinusoidal waveform, and are relatively large near zero-crossings on the trailing portions. Thus, attribute detections that rely on the trailing portions, such as fixed voltage detection, zero-crossing detection, line frequency detection, and the like, may be inaccurate.

According to an aspect of the disclosure, the detect-and-control circuit 120 is configured to detect attributes of the input power supply substantially independent of the load 104. In an embodiment, the detect-and-control circuit 120 detects attributes of the input power supply based on non-distorted portions or less distorted portions, such as the leading portions, of the input voltage $V_{IN}$ with regard to VSS. Further, because the sinusoidal waveform of the input power supply is a predictive waveform, the detection-and-control circuit 120 predicts certain attributes of the input power supply, based on the attribute detections on the leading portions of the input voltage $V_{IN}$ with regard to VSS. Thus, the attribute detection for the input power supply does not rely on attribute detection on the trailing portions of the input voltage $V_{IN}$ with regard to VSS.

In an embodiment, the detect-and-control circuit 120 includes a detection circuit 140 and a control circuit 130. The detection circuit 140 includes any suitable circuit to detect attributes, such as time of a fixed voltage value, zero-crossings, line frequency, and the like, of the AC power supply (the line voltage $V_{LINE}$ with regard to the neutral voltage $V_{NEUTRAL}$) according to the non-distorted portions and/or less distorted portions of the input voltage $V_{IN}$ with regard to VSS. The control circuit 130 generates suitable control signals based on the detected attributes, and provides the control signals to the regulation circuit 115.

In an embodiment, the detection circuit 140 includes comparators (not shown) configured to output signals that indicate when the input voltage $V_{IN}$ with regard to VSS are at certain voltage levels, such as fixed voltage level, proportional-to-peak values, and the like.

In another embodiment, the detection circuit 140 includes counters (not shown) to measure time durations between events, and to predict time for events. In an example, a counter is configured to include a count-up control, a count-down control, and a stop control. The count-up control is configured to activate the counter to count up from zero, for example. The stop control is configured to stop the counter from counting, and store the counted value. The count-down control is configured to activate the counter to count down from a previously stored value. The detection circuit 140 includes suitable control logic, such as in state machine form, and the like, to control the operations of the counter, for example, based on outputs from the comparators. In an example, the counter is configured to generate an output signal, such as a relatively high voltage level, when the counted value is equal to a specific value, such as zero.

In another embodiment, the detection circuit 140 includes integrators (not shown) to measure time durations between events, and to predict time for events. In an example, an integrator is configured to integrate during the count-up and discharge during the count-down. The integrator is configured to stop when its output reaches zero. The time constant of the integrator can also be configured such that the up and down integration rate are set differently.

It is noted that the detect-and-control circuit 120 can include any circuit components, such as logic circuit, state machine, processor, memory, digital circuit, analog circuit, and the like.

Figure 2:
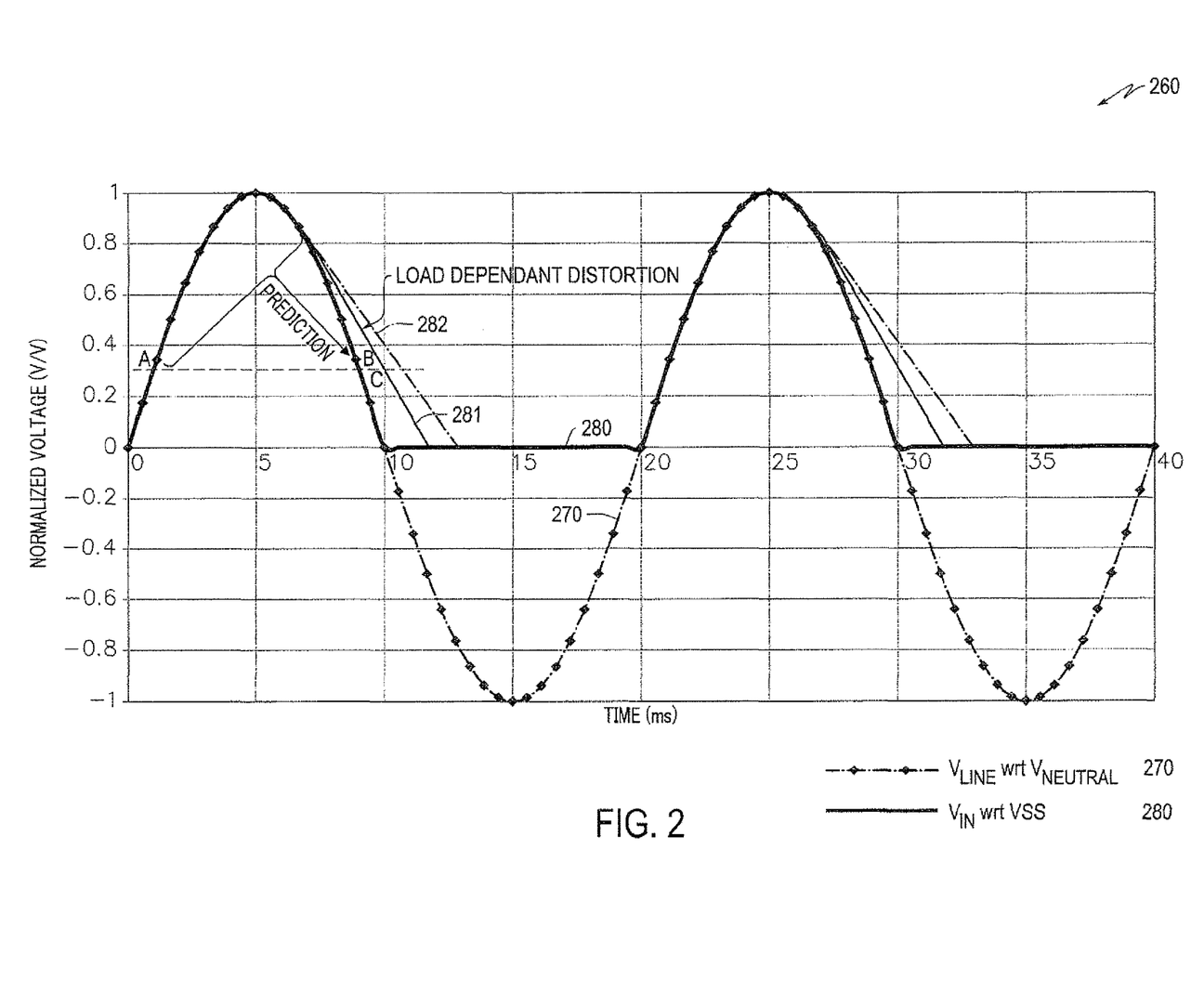
FIG. 2 shows a plot 260 of waveforms according to an embodiment of the disclosure.

FIG. 2 shows a plot 260 of waveform examples according to an embodiment of the disclosure. The plot 260 includes a first curve 270 and a second curve 280. The first curve 270 corresponds to the waveform of the normalized line voltage $V_{LINE}$ with regard to the neutral voltage $V_{NEUTRAL}$ in the FIG. 1 example, and the second curve 280 corresponds to the waveform of the normalized input voltage $V_{IN}$ with regard to VSS in the FIG. 1 example. The first curve 270 has a sinusoidal waveform. The second curve 280 is load dependent. For example, when the load 104 is relatively heavy, the second curve 280 has a half sinusoidal waveform. When the load 104 is relatively light, the trailing portions of the half sinusoidal waveform are distorted, such as the distorted trailing portions 281 and 282 shown in FIG. 2.

According to an aspect of the disclosure, the detect-and-control circuit 120 detects attributes of the line voltage $V_{LINE}$ with regard to the neutral Voltage $V_{NEUTRAL}$ based on non-distorted portions, such as the leading portions, of the input voltage $V_{IN}$ with regard to VSS. Further, because the sinusoidal waveform of the line voltage $V_{LINE}$ with regard to the neutral voltage $V_{NEUTRAL}$ is a predictive waveform, the detection-and-control circuit 120 predicts certain attributes of the line voltage $V_{LINE}$ with regard to the neutral voltage $V_{NEUTRAL}$, based on the attributes detections on the leading portions of the input voltage $V_{IN}$ with regard to VSS. Thus, the attribute detection for the input power supply does not rely on attribute detection on the trailing portions of the input voltage $V_{IN}$ with regard to VSS.

For example, a fixed voltage value (e.g., a fixed normalized voltage value) on the leading portion of the line voltage $V_{LINE}$ with regard to the neutral voltage $V_{NEUTRAL}$ can be detected based on a detection of a corresponding fixed voltage value on the leading portion of the input voltage $V_{IN}$ with regard to VSS, as shown by A; and a fixed voltage value on the trailing portion of the line voltage $V_{LINE}$ with regard to the neutral voltage $V_{NEUTRAL}$ is predicted based on attribute detections at the non-distorted, or less distorted portions of the input voltage $V_{IN}$ with regard to VSS, as shown by B. It is noted that the prediction can be based on one or more detections at the non-distorted portions or less-distorted portions.

Figure 3A:
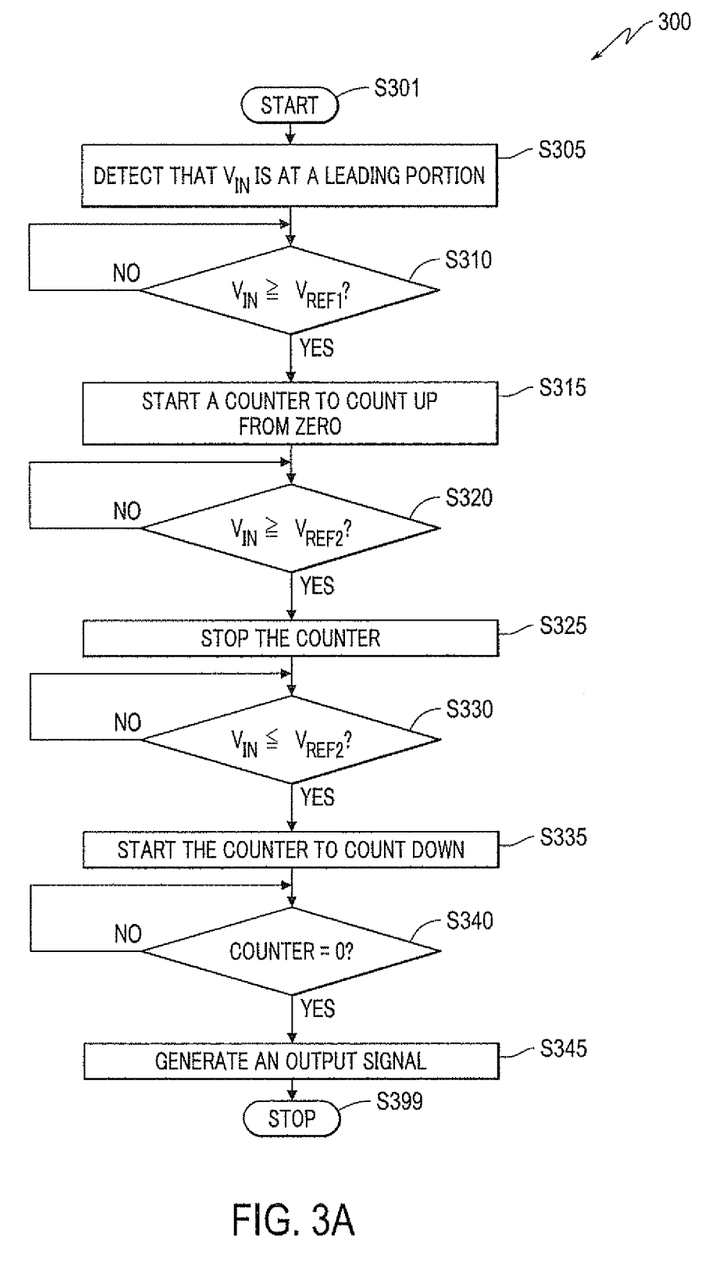
FIG. 3A shows a flowchart outlining a process example 300 according to an embodiment of the disclosure.

FIG. 3A shows a flowchart outlining a process example 300 for the detect-and-control circuit 120 to use a counter to predict a time when a trailing portion of the line voltage $V_{LINE}$ with regard to the neutral voltage $V_{NEUTRAL}$ has a fixed voltage value according to an embodiment of the disclosure. The process starts at S301, and proceeds to S305.

At S305, the detect-and-control circuit 120 detects that the input voltage $V_{IN}$ with regard to VSS is at a leading portion. In an example, the detect-and-control circuit 120 detects that the input voltage $V_{IN}$ with regard to VSS is larger than zero and consistently increases, and the detect-and-control circuit 120 determines that the input voltage $V_{IN}$ with regard to VSS is at a leading portion.

At S310, the detect-and-control circuit 120 compares the input voltage $V_{IN}$ with regard to VSS to a first reference voltage $V_{REF1}$, and determines whether the input voltage $V_{IN}$ with regard to VSS is equal to or larger than the first reference voltage $V_{REF1}$. It is noted that the first reference voltage $V_{REF1}$ can be determined based on the fixed voltage value. For example, when the scaling factor between the input voltage $V_{IN}$ and the line voltage $V_{LINE}$ is one, the first reference voltage $V_{REF1}$ is equal to the fixed voltage value. When the input voltage $V_{IN}$ with regard to VSS is equal to or larger than the first reference voltage $V_{REF1}$, the process proceeds to S315; otherwise, the process returns to S310.

At S315, the detect-and-control circuit 120 starts the counter to count up from zero.

At S320, the detect-and-control circuit 120 compares the input voltage $V_{IN}$ with regard to VSS to a second reference voltage $V_{REF2}$ that is larger than first reference voltage $V_{REF1}$, and determines whether the input voltage $V_{IN}$ with regard to VSS is equal to or larger than the second reference voltage $V_{REF2}$. In an embodiment, the second reference voltage $V_{REF2}$ is smaller than a peak value of the input voltage $V_{IN}$ with regard to VSS by a relatively small value. When the input voltage $V_{IN}$ with regard to VSS is equal to or larger than the second reference voltage $V_{REF2}$, the process proceeds to S325; otherwise, the process returns to S320.

At S325, the detect-and-control circuit 120 stops the counter, and stores the counted value.

At S330, the detect-and-control circuit 120 compares the input voltage $V_{IN}$ with regard to VSS to the second reference voltage $V_{REF2}$, and determines whether the input voltage $V_{IN}$ with regard to VSS is equal to or smaller than the second reference voltage $V_{REF2}$. When the input voltage $V_{IN}$ with regard to VSS is equal to or smaller than the second reference voltage $V_{REF2}$, the process proceeds to S335; otherwise, the process returns to S330.

At S335, the detect-and-control circuit 120 starts the counter to count down from the stored value.

At S340, the detect-and-control circuit 120 determines whether the counter counters to zero. In an embodiment, the counter outputs a relatively high voltage value when the counter counts to zero, and the detect-and-control circuit 120 is configured to wait for the counter to output the relatively high voltage value. When the counter outputs the relatively high voltage value, the process proceeds to S345; otherwise, the process returns to S340.

At S345, the detect-and-control circuit 120 generates an output signal indicating at that time the trailing portion of the line voltage $V_{LINE}$ with regard to the neutral voltage $V_{NEUTRAL}$ has the fixed voltage value. Then, the process proceeds to S399 and terminates.

It is noted that the process 300 can be suitably adjusted. In an example, the detect-and-control circuit 120 uses an integrator instead of the counter.

Figure 3B:
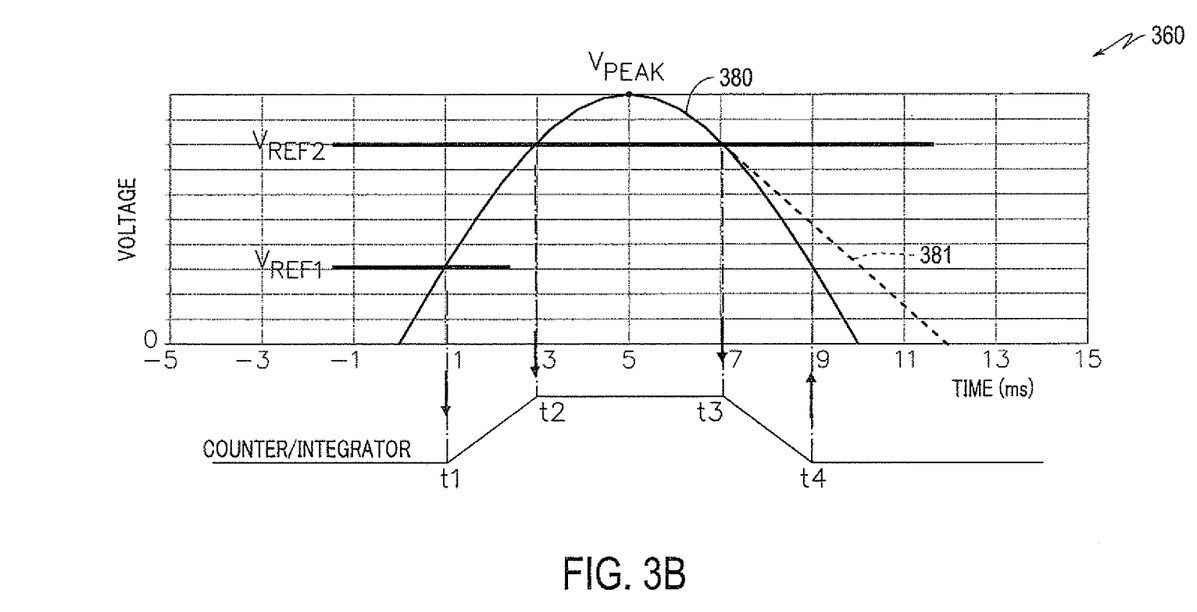
FIG. 3B shows a plot 360 of waveforms according to an embodiment of the disclosure.

FIG. 3B shows a plot 360 of waveform examples according to the process 300. The plot 360 includes a curve 380 of the input voltage $V_{IN}$ with regard to VSS. The trailing portion of the input voltage $V_{IN}$ with regard to VSS may be distorted, as shown by 381, due to load. The detect-and-control circuit 120 compares the input voltage $V_{IN}$ with regard to VSS with the first reference voltage $V_{REF1}$ and the second reference voltage $V_{REF2}$, and controls the operation of the counter/integrator based on the comparison.

For example, the input voltage $V_{IN}$ with regard to VSS starts to increase from time 0. At time t1, a first event that the input voltage $V_{IN}$ with regard to VSS is equal to the first reference voltage $V_{REF1}$ happens, and then the detect-and-control circuit 120 starts the counter to count up. The input voltage $V_{IN}$ with regard to VSS continues to increase. At time t2, a second event that the input voltage $V_{IN}$ with regard to VSS is equal to the second reference voltage $V_{REF2}$ happens, and then the detect-and-control circuit 120 stops the counter. It is noted that the counted number corresponds to a time duration between the first event and the second event. The input voltage $V_{IN}$ with regard to VSS continues to increase to the peak value $V_{PEAK}$ and starts to decrease. At time t3, a third event that the input voltage $V_{IN}$ with regard to VSS is equal to the second reference voltage $V_{REF2}$ happens, and then the detect-and-control circuit 120 starts the counter to count down. At time t4, the counter is zero, and the detect-and-control circuit 120 generates an output signal that indicates, at time t4, the trailing portion of the line voltage $V_{LINE}$ with regard to the neutral voltage $V_{NEUTRAL}$ has the fixed voltage value.

In an embodiment, the first reference voltage $V_{REF1}$ and the second reference voltage $V_{REF2}$ are generated based on a band-gap voltage that is substantially constant. For example, the band-gap voltage is substantially independent of process variations and temperature variations.

In another embodiment, the first reference voltage $V_{REF1}$ is proportional to the peak value $V_{PEAK}$ ($V_{REF1} = K \times V_{PEAK}$) and a time duration T1 between time t1 to time t4 is measured. Because arc sin $$K + \frac{T1/2}{T} \times 2\pi = \frac{\pi}{2},$$

where T denotes a period of the input power supply, then Eq. 1 is used to calculate a line frequency (f=1/T) of the input power supply:

$$f = \left(\frac{1}{2} - \frac{\arcsin K}{\pi}\right) / T1 \qquad \text{Eq. 1}$$

It is noted that the line frequency of the input power supply can be calculated based on detections of two proportional-to-peak voltages on the leading portions of the input voltage $V_{IN}$ with regard to VSS to improve accuracy.

Figure 4A:
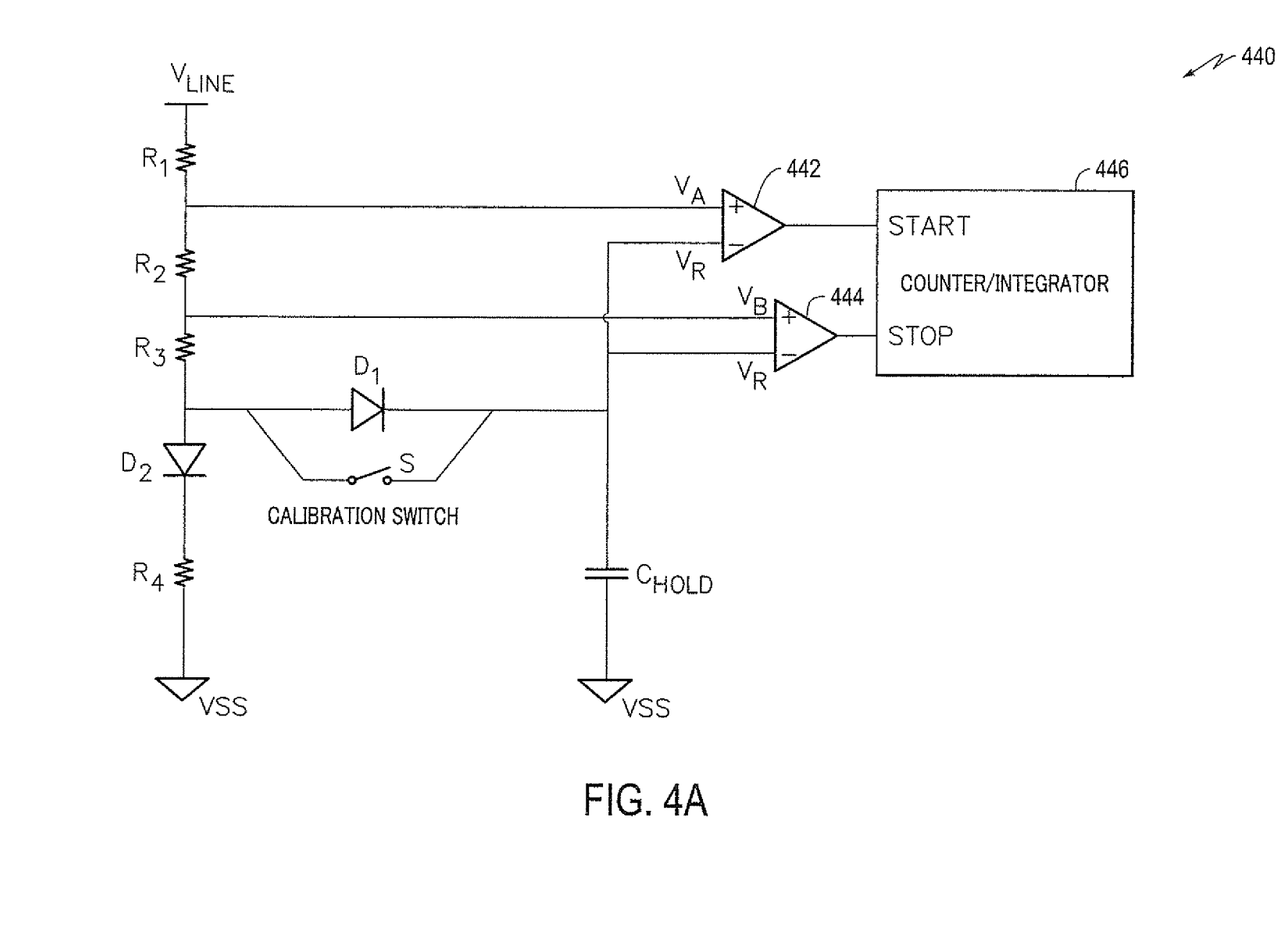
FIG. 4A shows a block diagram of a detection circuit 440 according to an embodiment of the disclosure.

FIG. 4A shows a block diagram of a detection circuit 440 according to an embodiment of the disclosure. The detection circuit 440 can be included in the detect-and-control circuit 120 to detect a line frequency of the AC power supply. The detection circuit 440 includes four resisters $R_1$-$R_4$, two diodes $D_1$ and $D_2$, a calibration switch S, a capacitor $C_{HOLD}$, two comparators 442 and 444, and a counter/integrator 446. These elements are coupled together as shown in FIG. 4A.

Due to the direction of the diode $D_1$, the voltage $V_R$ held by the capacitor $C_{HOLD}$ corresponds to a fraction of the peak value $V_{PEAK}$ $$\left(V_R = V_{PEAK} \times \frac{R_4}{R_1 + R_2 + R_3 + R_4}\right).$$

The comparator 442 compares a voltage $V_A$ to the voltage $V_R$, and starts the counter/integrator 446 when a first event that the voltage $V_A$ is equal to or larger than the voltage $V_R$ happens, which means $$V_{LINE} \geq \frac{R_4}{R_2 + R_3 + R_4} \times V_{PEAK}.$$

The comparator 444 compares a voltage $V_B$ to the voltage $V_R$, and stops the counter/integrator 446 when a second event that the voltage $V_B$ is equal to or larger than the voltage $V_R$ happens, which means $$V_{LINE} \geq \frac{R_4}{R_3 + R_4} \times V_{PEAK}.$$

The counted number corresponds to a time duration T1 between the first event and the second event. The time duration can be used to calculate the line frequency.

In an embodiment, after the counter/integrator 446 stops, a pulse signal controls the calibration switch S to close and open. Thus, the voltage held by the capacitor $C_{HOLD}$ corresponds to the fraction of the most recent peak value $V_{PEAK}$.

It is noted that, in an embodiment, the detection circuit 440 can be implemented on an IC chip. In another embodiment, a portion of the detection circuit 440, such as the comparators 442 and 444 and the counter/integrator 446 can be implemented on an IC chip.

Figure 4B:
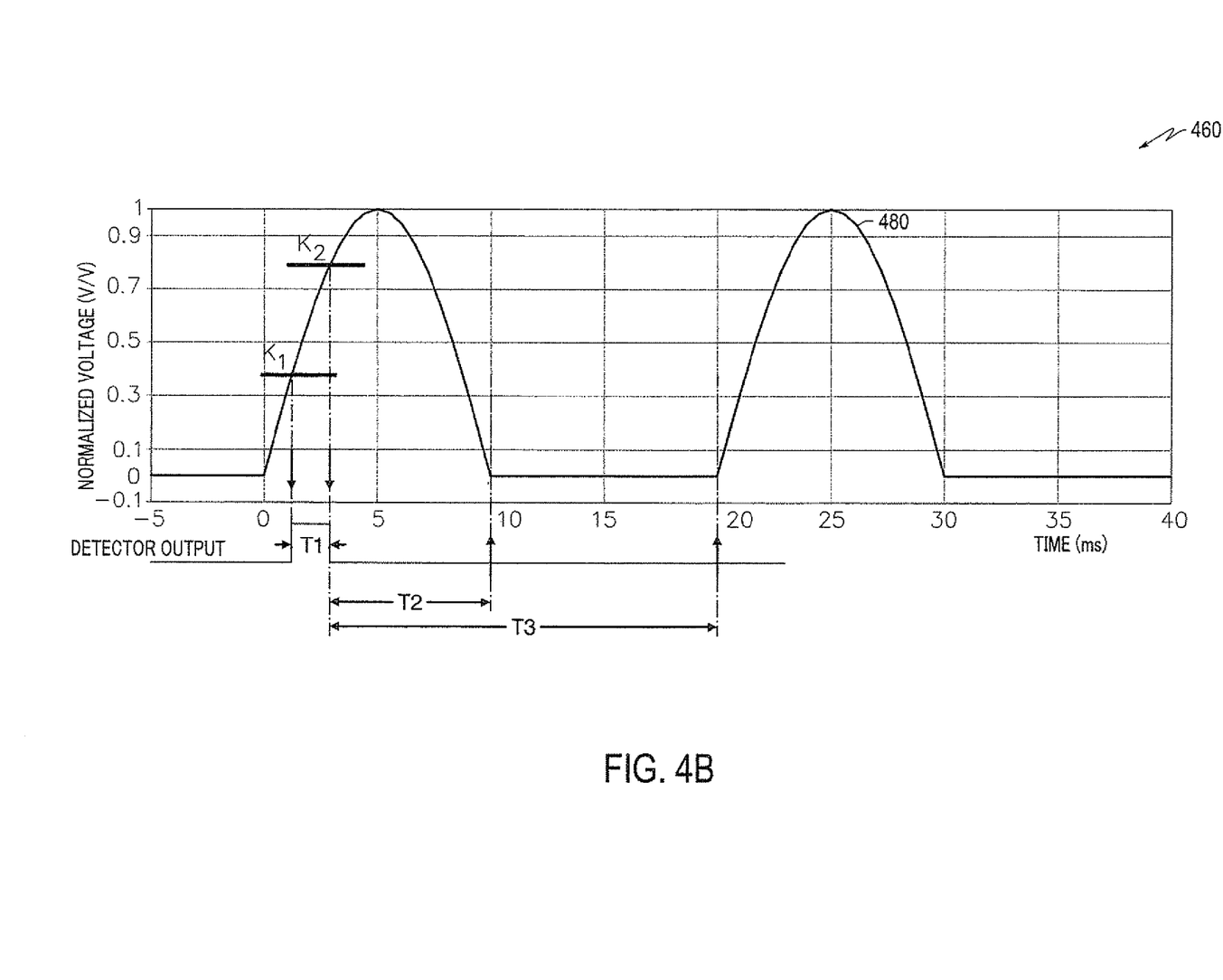
FIG. 4B shows a plot 460 of waveforms according to an embodiment of the disclosure.

FIG. 4B shows a plot 460 of waveform examples for the detection circuit 440 according to an embodiment of the disclosure. The plot 460 includes a curve 480 of the normalized line voltage $V_{LINE}$ with regard to VSS. The detection circuit 400 measures a time during T1 between the first event that the normalized line voltage $V_{LINE}$ with regard to VSS is equal to or larger than K1

$$\left(K1 = \frac{R_4}{R_2 + R_3 + R_4}\right),$$

and the second event that the normalized line voltage $V_{LINE}$ with regard to VSS is larger than K2

$$\left(K2 = \frac{R_4}{R_3 + R_4}\right).$$

Then, Eq. 2 is used to calculate the line frequency:

$$f = \frac{(\arcsin K2 - \arcsin K1)}{T1 \times 2\pi} \qquad \text{Eq. 2}$$

According to an embodiment of the disclosure, the detect-and-control circuit 120 can further calculate time of zero-crossings. For example, Eq. 3 is used to calculate a time duration T2 from the second event to a first zero crossing, and Eq. 4 is used to calculate a time duration T3 from the second event to a second zero crossing:

$$T2 = \frac{T1 \times (\pi - \arcsin K2)}{(\arcsin K2 - \arcsin K1)} \qquad \text{Eq. 3}$$

$$T3 = T2 + \frac{1}{2f} \qquad \text{Eq. 4}$$

Figure 5A:
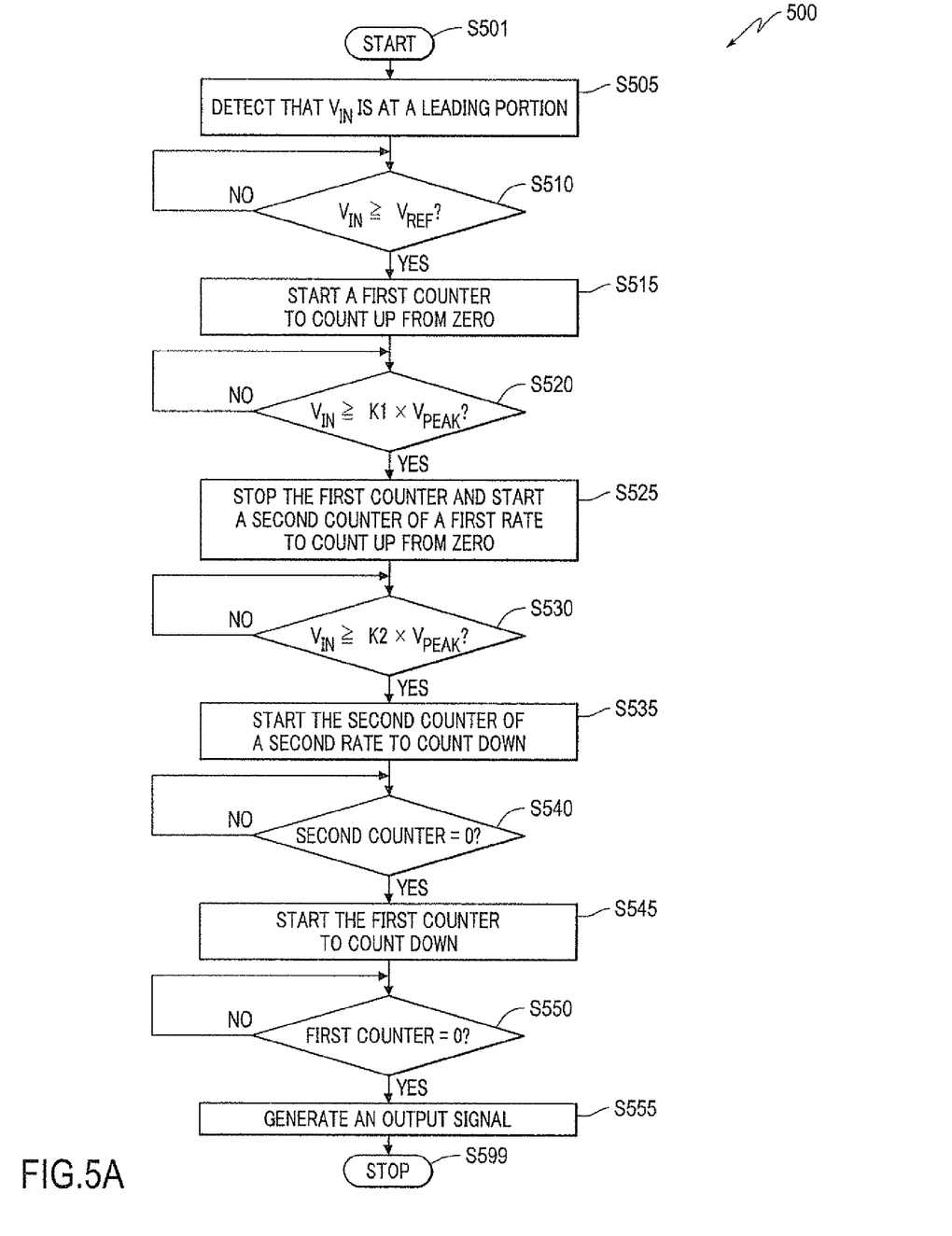
FIG. 5A shows a flowchart outlining a process example 500 according to an embodiment of the disclosure.

FIG. 5A shows a flowchart outlining a process example 500 for the detect-and-control circuit 120 to use two counters to calculate the line frequency of the AC power supply and to predict a time when the trailing portion of the line voltage $V_{LINE}$ with regard to the neutral voltage $V_{NEUTRAL}$ has a fixed voltage value. The process starts at S501, and proceeds to S505.

At S505, the detect-and-control circuit 120 detects that the input voltage $V_{IN}$ with regard to VSS is at a leading portion. In an example, the detect-and-control circuit 120 detects that the input voltage $V_{IN}$ with regard to VSS is larger than zero and consistently increases. Then, the detect-and-control circuit 120 determines that the input voltage $V_{IN}$ with regard to VSS is at a leading portion.

At S510, the detect-and-control circuit 120 compares the input voltage $V_{IN}$ with regard to VSS to a reference voltage $V_{REF}$, and determines whether the input voltage $V_{IN}$ with regard to VSS is equal to or larger than the reference voltage $V_{REF}$. It is noted that the reference voltage $V_{REF}$ can be determined based on the fixed voltage value. For example, when the scaling factor between the input voltage $V_{IN}$ and the line voltage $V_{LINE}$ is one, the reference voltage $V_{REF}$ is equal to the fixed voltage value. When the input voltage $V_{IN}$ with regard to VSS is equal to or larger than the reference voltage $V_{REF}$, the process proceeds to S515; otherwise, the process returns to S510.

At S515, the detect-and-control circuit 120 starts a first counter to count up from zero.

At S520, the detect-and-control circuit 120 compares the input voltage $V_{IN}$ with regard to VSS to a first proportional-to-peak voltage TH1 (K1×$V_{PEAK}$) that is larger than reference voltage $V_{REF}$, and determines whether the input voltage $V_{IN}$ with regard to VSS is larger than the first proportional-to-peak voltage TH1. When the input voltage $V_{IN}$ with regard to VSS is equal to or larger than the first proportional-to-peak voltage TH1, the process proceeds to S525; otherwise, the process returns to S520.

At S525, the detect-and-control circuit 120 stops the first counter, and stores the counted value. Further, the detect-and-control circuit 120 starts a second counter of a first rate to count up from zero.

At S530, the detect-and-control circuit 120 compares the input voltage $V_{IN}$ with regard to VSS to a second proportional-to-peak voltage TH2 (K2×$V_{PEAK}$) that is larger than the first proportional-to-peak voltage TH1 and determines whether the input voltage $V_{IN}$ with regard to VSS is equal to or larger than the second proportional-to-peak voltage TH2. When the input voltage $V_{IN}$ with regard to VSS is equal to or larger than the second proportional-to-peak voltage TH2, the process proceeds to S535; otherwise, the process returns to S530.

At S535, the detect-and-control circuit 120 stops the second counter from counting up and starts the second counter of a second rate to count down.

At S540, the detect-and-control circuit 120 determines whether the second counter counts to zero. When the second counter counts to zero, the process proceeds to S545; otherwise, the process returns to S540.

At S545, the detect-and-control circuit 120 starts the first counter to count down.

At S550, the detect-and-control circuit 120 determines whether the first counter counts to zero. When the second counter counts to zero, the process proceeds to S555; otherwise, the process returns to S550.

At S555, the detect-and-control circuit 120 generates an output signal indicating at that time the trailing portion of the line voltage $V_{LINE}$ with regard to the neutral voltage $V_{NEUTRAL}$ has the fixed voltage value. Then, the process proceeds to S599 and terminates.

It is noted that the process 500 can be suitably adjusted. In an example, the detect-and-control circuit 120 uses integrators instead of the counters.

Figure 5B:
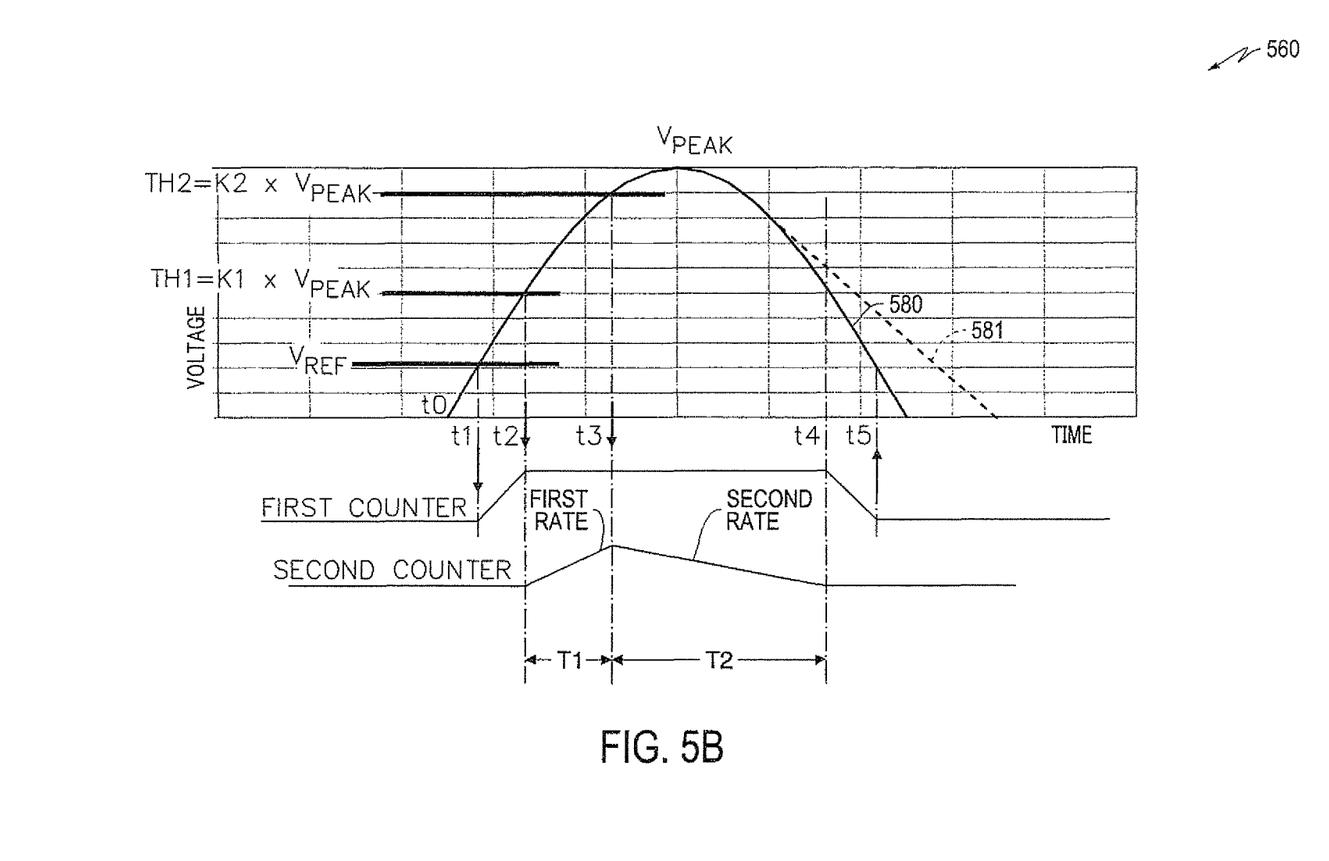
FIG. 5B shows a plot 560 of waveforms according to an embodiment of the disclosure.

FIG. 5B shows a plot 560 of waveform examples according to the process 500. The plot 560 includes a curve 580 of the input voltage $V_{IN}$ with regard to VSS. The trailing portion of the input voltage $V_{IN}$ with regard to VSS may be distorted, as shown by 581, due to load. The detect-and-control circuit 120 compares the input voltage $V_{IN}$ with regard to VSS with the reference voltage $V_{REF}$, the first proportional-to-peak voltage TH1, and the second proportional-to-peak voltage TH2, and controls the operation of the first counter and the second counter based on the comparisons.

For example, the input voltage $V_{IN}$ with regard to VSS starts to increase from time t0. At time t1, a first event that the input voltage $V_{IN}$ with regard to VSS is equal to the reference voltage $V_{REF}$ happens, and then the detect-and-control circuit 120 starts the first counter to count up. The input voltage $V_{IN}$ with regard to VSS continues to increase. At time t2, a second event that the input voltage $V_{IN}$ with regard to VSS is equal to the first proportional-to-peak voltage TH1 happens, and then the detect-and-control circuit 120 stops the first counter and starts the second counter of a first rate to count up from zero. The input voltage $V_{IN}$ with regard to VSS continues to increase. At time t3, a third event that the input voltage $V_{IN}$ with regard to VSS is equal to the second proportional-to-peak voltage TH2 happens, and then the detect-and-control circuit 120 stops the second counter from counting up and starts the second counter to count down at a second rate. The input voltage $V_{IN}$ with regard to VSS continues to increase to the peak value $V_{PEAK}$ and starts to decrease. At time t4, the second counter counts to zero, and then the detect-and-control circuit 120 starts the first counter to count down. At time t5, the first counter is zero, and the detect-and-control circuit 120 generates an output signal indicating at that time the trailing portion of the line voltage $V_{LINE}$ with regard to the neutral voltage $V_{NEUTRAL}$ has the fixed voltage value.

It is noted that the first rate and the second rate can be suitably chosen according to Eq. 5:

$$\frac{\text{first rate}}{\text{second rate}} = \frac{\pi - \arcsin K1 - \arcsin K2}{\arcsin K2 - \arcsin K1} \qquad \text{Eq. 5}$$

In addition, the line frequency can be calculated using Eq. 2 based on K1, K2 and the time duration T1 between time t2 and time t3, for example.

While the subject matter of the present disclosure has been described in conjunction with the specific embodiments thereof that are proposed as examples, it is evident that many alternatives, modifications, and variations will be apparent to those skilled in the art. Accordingly, embodiments of the present disclosure as set forth herein are intended to be illustrative, not limiting. There are changes that may be made without departing from the scope of the present disclosure.

What is claimed is:

1. A method, comprising:
   receiving a first signal generated based on a second signal that is predictive, the first signal including a portion that substantially corresponds to the second signal;
   detecting attributes of the portion of the first signal that substantially corresponds to the second signal;
   determining attributes of the second signal based on the attributes of the portion of the first signal; and
   generating control signals to regulate the second signal based upon the determined attributes of the second signal.

2. The method of claim 1, wherein receiving the first signal generated based on the second signal that is predictive further comprises:
   receiving the first signal generated based on the second signal that includes a leading portion and a trailing portion that is symmetrical to the leading portion, the portion of the first signal substantially corresponding to one of the leading portion and the trailing portion of the second signal.

3. The method of claim 1, wherein receiving the first signal generated based on the second signal that is predictive further comprises:
   receiving the first signal generated based on the second signal that has a sinusoidal waveform, the first signal including a leading portion that substantially corresponds to the second signal.

4. The method of claim 3, further comprising:
   detecting a fixed level on the leading portion of the first signal; and
   predicting a time when a trailing portion of the second signal is at the fixed level.

5. The method of claim 4, further comprising:
   detecting a second level that is larger than the fixed level on the leading portion of the first signal;
   measuring a time duration between the detection of the fixed level and the second level;
   detecting the second level on the trailing portion of the first signal; and
   predicting the time when the trailing portion of the second signal is at the fixed level based on the detection of the second level on the trailing portion of the first signal and the measured time duration.

6. The method of claim 4, wherein predicting the time when the trailing portion of the second signal is at the fixed level further comprises:
   enabling a first counter/integrator to count up from a first initial number when the fixed level on the leading portion of the first signal is detected;
   stopping the first counter/integrator and enabling a second counter/integrator to count up from a second initial number at a first rate when a first proportional-to-peak level on the leading portion of the first signal is detected;
   enabling the second counter/integrator to count down at a second rate when a second proportional-to-peak level on the leading portion of the first signal is detected;
   enabling the first counter/integrator to count down when the second counter/integrator returns to the second initial number; and
   generating an output signal indicative of the time when the first counter/integrator returns to the first initial number.

7. The method of claim 3, further comprising:
   detecting a first proportional-to-peak level on the leading portion of the first signal;
   detecting a second proportional-to-peak level on the leading portion of the first signal; and
   measuring a time duration between the detections of the first and second proportional-to-peak levels.

8. The method of claim 7, further comprising:
   determining at least one of a frequency and a period of the second signal based on the first proportional-to-peak level, the second proportional-to-peak level and the time duration.

9. The method of claim 7, further comprising:
   determining a zero-crossing time of the second signal based on the first proportional-to-peak level, the second proportional-to-peak level and a time duration between the detections.

10. The method according to claim 1, further comprising:
    outputting the control signals to a regulation circuit.

11. The method according to claim 10, wherein the control signals include power factor correction control signals.

12. A circuit, comprising:
    a detection circuit configured to receive a first signal generated based on a second signal that is predictive, the first signal including a portion that substantially corresponds to the second signal, detect attributes of the portion of the first signal that substantially corresponds to the second signal, and determine attributes of the second signal based on the attributes of the portion of the first signal; and
    a control circuit configured to generate control signals to regulate the second signal based upon the determined attributes of the second signal.

13. The circuit of claim 12, wherein the second signal includes a leading portion and a trailing portion that is symmetrical to the leading portion, and the portion of the first signal substantially corresponds to one of the leading portion and the trailing portion of the second signal.

14. The circuit of claim 12, the second signal has a sinusoidal waveform and the first signal includes a leading portion that substantially corresponds to the second signal.

15. The circuit of claim 14, wherein the detection circuit is configured to detecting a fixed level on the leading portion of the first signal, and predict a time when a trailing portion of the second signal is at the fixed level.

16. The circuit of claim 15, wherein the detection circuit is configured to detect a second level that is larger than the fixed level on the leading portion of the first signal, measure a time duration between the detection of the fixed level and the second level, detect the second level on the trailing portion of the first signal, and predict the time when the trailing portion of the second signal is at the fixed level based on the detection of the second level on the trailing portion of the first signal and the measured time duration.

17. The circuit of claim 15, wherein the detection circuit comprises:
    a first counter/integrator configured to count up and count down at a constant rate; and
    a second counter/integrator configured to count up at a first rate and count down at a second rate, and
    the detection circuit is configured to enable the first counter/integrator to count up from a first initial number when the fixed level on the leading portion of the first signal is detected, stop the first counter/integrator and enable the second counter/integrator to count up from a second initial number at the first rate when a first proportional-to-peak level on the leading portion of the first signal is detected, enable the second counter/integrator to count down at the second rate when a second proportional-to-peak level on the leading portion of the first signal is detected, enable the first counter/integrator to count down when the second counter/integrator returns to the second initial number, and generate an output signal indicative of the time when the first counter/integrator returns to the first initial number.

18. The circuit of claim 14, wherein the detection circuit further comprises:
a first comparator configured to detect a first time when the leading portion of the first signal is at a first proportional-to-peak level;
a second comparator configured to detect a second time when the leading portion of the first signal is at a second proportional-to-peak level; and
a counter/integrator configured to start counting at the first time and stop counting at the second time to measure a time duration between the first time and the second time.

19. The circuit of claim 18, wherein the detection circuit further comprises:
a capacitor configured to hold a voltage based on a peak level of the first signal; and
a voltage divider configured to provide voltage inputs to the first comparator and the second comparator according to the first proportional-to-peak level and the second proportional-to-peak level.

20. The circuit of claim 18, wherein the detection circuit is configured to determine at least one of a frequency and a period of the second signal based on the first proportional-to-peak level, the second proportional-to-peak level and the time duration.

21. The circuit of claim 18, wherein the detection circuit is configured to determine a zero-crossing time of the second signal based on the first proportional-to-peak level, the second proportional-to-peak level and a time duration between the detections.

22. A power circuit for providing power to a load, comprising:
a regulation circuit configured to receive an alternating current (AC) power supply having a sinusoidal waveform, regulate the AC power supply to generate an output power supply, and provide the output power supply to the load; and
a detect-and-control circuit including a detection circuit and a control circuit, wherein:
the detection circuit is configured to receive a signal generated based on the AC power supply, the signal including a portion that substantially corresponds to the AC power supply, detect attributes of the portion of the signal that substantially corresponds to the AC power supply, and determine attributes of the AC power supply based on the attributes of the portion of the signal that substantially corresponds to the AC power supply; and
the control circuit is configured to generate control signals based on the determined attributes of the AC power supply, and provide the control signals to the regulation circuit to regulate the AC power supply.

23. The power circuit of claim 22, wherein the regulation circuit comprises:
a power factor correction circuit configured to regulate the AC power supply to generate the output power supply with phase-aligned voltage and current.

24. The power circuit of claim 23, wherein the detection circuit is configured to detect at least one of fixed levels of the AC power supply, a frequency of the AC power supply, and zero-crossings of the AC power supply based on the attributes of the portion of the signal that substantially corresponds to the AC power supply.

* * * * *